United States Patent
Chesal et al.

(10) Patent No.: US 7,389,489 B1
(45) Date of Patent: Jun. 17, 2008

(54) TECHNIQUES FOR EDITING CIRCUIT DESIGN FILES TO BE COMPATIBLE WITH A NEW PROGRAMMABLE IC

(75) Inventors: Ian Chesal, Toronto (CA); Kevin Chan, Scarborough (CA); Subianto Windoro, San Jose, CA (US); Minh Mac, San Jose, CA (US); Terry Borer, Toronto (CA); Stephen Brown, Toronto (CA); Irene Sujanto, San Jose, CA (US); Sheac Yee Lim, San Jose, CA (US)

(73) Assignee: Altera Corporation, San Jose, CA (US)

( * ) Notice: Subject to any disclaimer, the term of this patent is extended or adjusted under 35 U.S.C. 154(b) by 469 days.

(21) Appl. No.: 10/840,206

(22) Filed: May 5, 2004

(51) Int. Cl.
*G06F 17/50* (2006.01)

(52) U.S. Cl. .............................. 716/18; 716/3

(58) Field of Classification Search .................... 716/1, 716/3, 5, 18; 717/126, 127, 106
See application file for complete search history.

(56) References Cited

U.S. PATENT DOCUMENTS

| | | | |
|---|---|---|---|
| 5,995,736 A * | 11/1999 | Aleksic et al. ............... 716/18 |
| 6,536,017 B1 * | 3/2003 | Sanders .......................... 716/3 |
| 7,024,661 B2 * | 4/2006 | Leino et al. ................. 717/126 |
| 2004/0163072 A1 * | 8/2004 | Levy ........................... 717/106 |
| 2005/0114818 A1 * | 5/2005 | Khakzadi et al. ............. 716/11 |

OTHER PUBLICATIONS

"Altera Design Flow for Xilinx Users," Application Design Note version 2.0 from Altera Corporation San Jose, CA (Jul. 2003).

* cited by examiner

*Primary Examiner*—Vuthe Siek
(74) *Attorney, Agent, or Firm*—Townsend and Townsend and Crew, LLP

(57) ABSTRACT

Techniques are provided for converting a circuit design file so that it is compatible with a new programmable IC. Black box declarations and instances of black boxes in the circuit design file are located automatically. Then, information about the function and structure of the black boxes is gathered from various user files. This information is used to convert the black box declarations and instances into equivalent declarations and instances that are compatible with the new programmable IC. The design conversion process is performed quickly and automatically with minimal user input. User input is only needed to identify recognized black boxes.

18 Claims, 3 Drawing Sheets

TECHNIQUES FOR EDITING CIRCUIT DESIGN FILES TO BE COMPATIBLE WITH A NEW PROGRAMMABLE IC

BACKGROUND OF THE INVENTION

The present invention provides techniques for editing circuit design code so that it is compatible with a new programmable integrated circuit (IC), and more particularly, to techniques for converting code describing a circuit design written for a first programmable integrated circuit into code that is compatible with a second programmable integrated circuit.

A programmable logic integrated circuit (IC) is a general purpose IC that can be configured to implement a variety of circuit designs. Programmable logic ICs typically include repeating arrays of programmable logic blocks and memory blocks. Examples of programmable logic ICs include field programmable gate arrays (FPGA), programmable logic devices (PLDs), programmable logic arrays (PLAs), configurable logic arrays, etc.

Hardware circuit designs are typically expressed in computer aided design software using a hardware description language (HDL) language such as Verilog or VHDL. HDL programs of circuit designs that are intended to be programmed into a programmable IC are usually targeted to specific IC architecture.

For example, some FPGA manufacturers provide primitives in their HDL libraries. A primitive is a basic building block that can be used to describe a portion of a circuit design. A multiplier block is an example of a primitive. Primitives are typically provided in HDL libraries to simplify the task of designing a complicated circuit that is targeted for a particular FPGA. Many HDL libraries also have a larger or more complex building block of a hardware circuit (such as a phase locked loop).

Often, users of FPGAs desire to switch from one type of FPGA to another. A user may desire to purchase an FPGA made by a new manufacturer after an FPGA-specific HDL program has already been created describing the user's circuit design. The new manufacturer can increase the chances of obtaining a client's business if the HDL program for the circuit design can be converted to be compatible with the new manufacturer's FPGA. However, it takes a substantial amount of time and effort to manually edit a HDL program so that is compatible with a new FPGA.

Previously known methods have been put forth for converting a circuit design file into a file that is compatible with a different FPGA. These methods require a considerable amount of input from the user at runtime to perform the conversion. During the conversion process, the user has to answer numerous design specific questions.

For example, the user has to identify elements in the circuit design as block boxes. The user also has to describe the implementation of the identified black boxes. To answer these questions, the user must possess a very detailed understanding of the circuit design. To obtain such a level of understanding, the user must spend a considerable amount of time sifting through the circuit design files and the timing constraint files associated with it.

Thus, the design conversion techniques are slow and time consuming. For example, it may take between 5 to 14 days to convert a circuit design, depending on the size and complexity of the design. Design conversions also require a good understanding of the software tools and the architecture primitives for the two FPGAs.

Therefore, it would be desirable to provide more efficient techniques for converting a file containing code that describes a circuit design for a programmable IC into a file that is compatible with a new programmable IC, without requiring the user to have a detailed understanding of the circuit design.

BRIEF SUMMARY OF THE INVENTION

The present invention provides techniques for editing a file containing code describing a circuit design written for a first programmable IC so that it is compatible with a second programmable IC. The present invention automatically locates black box declarations and instances of black boxes in the file. Information about the function and structure of the black boxes is gathered from various files. This information is used to convert the black box declarations and instances into equivalent declarations and instances that are compatible with the second programmable IC.

The design conversion process is performed quickly and automatically with minimal user input. User input is only needed for limited purposes, for example, to identify unrecognizable black boxes. The present invention can also converts user constraints such as timing constraints into a format that is compatible with the second programmable IC.

Other objects, features, and advantages of the present invention will become apparent upon consideration of the following detailed description and the accompanying drawings, in which like reference designations represent like features throughout the figures.

DETAILED DESCRIPTION OF THE INVENTION

The present invention provides automated techniques for translating a circuit design for one programmable IC to another that do not require detailed user knowledge about the circuit design. The present invention automatically reads the circuit design software files to gather information about the circuit design. This information is then used to convert design-specific black boxes from one programmable IC format to another, with very little intervention from the user.

The present invention can also convert timing requirements specific to one programmable IC to format that is compatible with a second programmable IC. Although portions of the present invention are discussed primarily in the context of FPGAs or PLDs, it should be understood that the principles of the present invention can be applied to any type of programmable IC including FPGAs, PLDs, MPLDs, CPLDs, PLAs, configurable logic arrays, etc.

Figure 1:
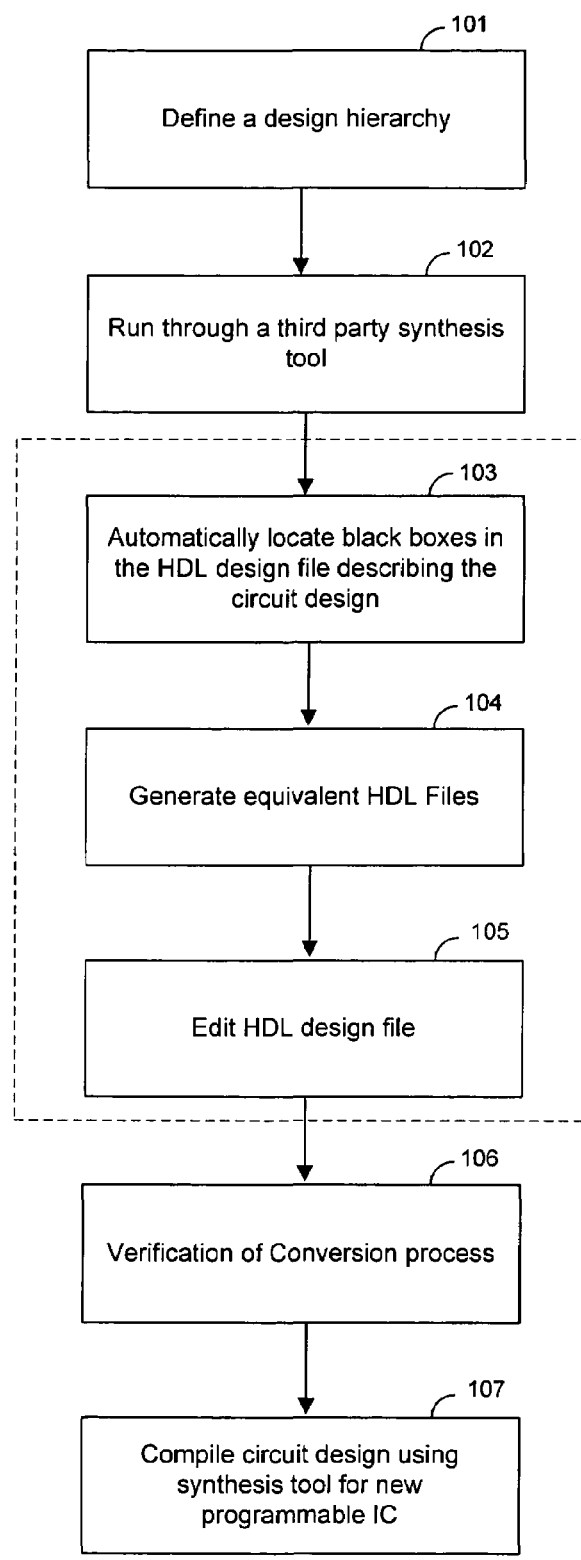
FIG. 1 is a flow chart that illustrates a process for editing a circuit design file written for a first programmable logic IC so that it is compatible with a second programmable logic IC, according to an embodiment of the present invention.

FIG. 1 is a flow chart that illustrates a first embodiment of the present invention in the context of a general design conversion process. At step 101, a design hierarchy is defined that indicates relationships between the circuit blocks within the design.

At step 102, a third party synthesis tool converts the user design into logic gates that can be programmed onto a specific programmable logic IC. During synthesis, sub-circuits in a user circuit design are converted into an equivalent network of logic gates that perform the same function. The synthesis tool also performs technology mapping. During technology mapping, the network of logic gates in the user-made design are transformed into logic circuits such as lookup tables and registers that can be placed onto a programmable logic IC.

The synthesis tool creates a user constraint file for the circuit design. The user constraint file includes information such as timing constraints and placement constraints for the circuit design. The timing constraints indicate limits on signal delay times for various signals in the circuit design. The placement constraints circumscribe where various circuit blocks in the circuit design can be placed on the programmable IC. The timing and placement constraints are necessary to meet the user's performance requirements for the circuit design.

The present invention analyzes a design file containing HDL code that models a circuit design. Such a design file contains numerous black boxes. A black box is a circuit block within the circuit design. Black boxes include building blocks such as primitives, larger building blocks, and any other circuit blocks within the circuit design. A MegaFunction is an example of a lager building block provided by a MegaWizard design tool. A MegaFunction provides a user interface that allows a user to specify parameters for the circuit so that the building block can be customized for a particular circuit design.

The present invention has modified steps 103-105 of the flow shown in FIG. 1. At step 103, black boxes in the HDL design file that describe the circuit design are automatically located. At step 104, equivalent HDL black boxes that are compatible with the new programmable logic IC are generated. At step 105, the HDL design file is edited to replace the black boxes with their equivalent black boxes. For example, the techniques of the present invention can be used to convert Coregen (.xco) files into MegaWizard files.

Figure 2:
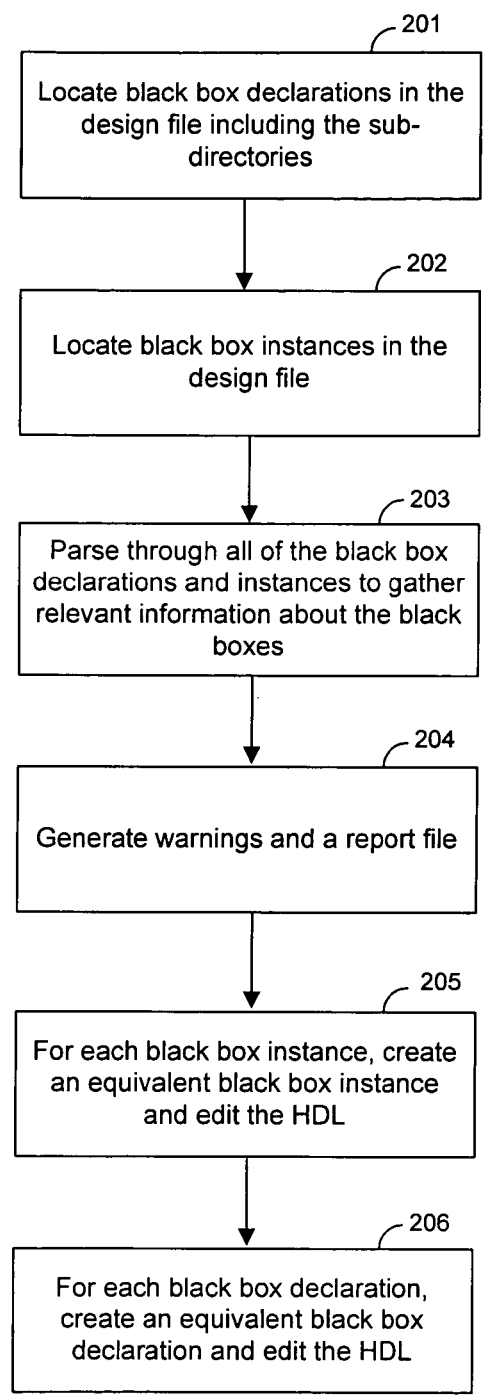
FIG. 2 is a flow chart that illustrates a more detailed process for editing a circuit design file so that it is compatible with a second programmable logic IC, according to another embodiment of the present invention.

Steps 103-105 are now discussed in further detail with respect to the flow chart shown in FIG. 2. The steps shown in FIG. 2 are examples that are described below for illustrative purposes and are not intended to limit the scope of the present invention.

At step 201 in FIG. 2, the design file and all of the subdirectories in the design file are searched to locate black box declarations. A black box declaration declares the black box circuit block within the HDL code.

A black box declaration typically includes a name. Also, a black box declaration typically defines its input and output ports, but has an undefined or empty body. The declaration only defines the structure of the black box. The present invention can identify every black box in a design file by searching for HDL code that has the characteristics of a black box declaration. For example, if a block of code in a design file does not contain a body definition, it is assumed that the code is instantiating a block box, such as a primitive, that the user is able to define without a definition in the body. Therefore, it is assumed that the block of code is a black box declaration.

At step 202, instances of the black boxes are located in the design file. An instance of a black box is a use of the black box in the HDL code after the black box has been declared. After a declaration of a black box has been identified in a design file, all instances of the black box with the same name are located at step 203.

At step 203, all of the black box declarations and instances in the design file are parsed to determine whether they can be converted to an equivalent black box compatible with another programmable IC. The present invention attempts to match each black box in the design file with an equivalent black box that is compatible with the other programmable IC. An equivalent black box is usually a circuit block description in a HDL library that performs the same function. The present invention is able to match black boxes in a design file written for a first FPGA to equivalent black boxes that are compatible with a second FPGA.

Each black box in a user's HDL design file has a name or type that identifies what kind of a black box it is and what it's function is. Typically, a file that is associated with the design file contains detailed information about the black boxes in the design file. For example, the associated file may correspond a black box name to a circuit block type or a functional description.

Using a more specific example, a name for a multiplier can be MUL. Information in a file identifies black boxes having a name that includes the string "MUL" as multiplier blocks. Information in the file may additionally identify a particular black box called MUL18 as an 18×18 asynchronous multiplier.

The detailed information about each black box declaration and each back box instance is gathered from the associated file or files. This detailed information is then used to convert the black box instances and declarations into their functional equivalents that are compatible with the second FPGA. The relevant information about each black box declaration includes, for example, the type of black box, the number of input ports, the number of output ports, the function it performs, etc. The relevant information about each black box instance includes, for example, the terminals that each port of a black box instance are connected to, the input signals of each instance, the output signals of each instance, etc.

After all of the relevant information is collected for the black boxes and the black box instances, this information is used to replace the black boxes and the black box instances in the design file with equivalent black boxes and black box instances that are compatible with the second FPGA. The present invention searches through the second FPGA's design library to locate equivalent black boxes that perform the same function.

For example, a black box in a design file may be identified as a 16×32 bit RAM block. The RAM block is replaced with an equivalent 16×32 bit RAM black box that is compatible with the second FPGA. Each instance of the RAM black box in the design file is also replaced by an equivalent instance. The input and output ports of the equivalent RAM instances are connected to the same signals as the instances of the RAM block in the original design file.

The black box replacement process usually requires minimal intervention by the user, because most of the black boxes in a design file are replaced automatically. The design conversion techniques of the present require far less human intervention than previously known techniques, which required the user to identify each black box. The present invention provides a faster and more efficient way to replace black boxes in user design files. Minimizing the need for human intervention greatly reduces the number errors in the design conversion process and provides a better way to keep track of all of the changes that need to be made to a design file to make a successful conversion. Previously known techniques were far more prone to errors, because a user had to be actively involved in the conversion of numerous (often thousands) of black boxes.

However, some of the black boxes in a design file may not be recognizable. For example, a black box in a user design file may not have an equivalent black box in the HDL library of the second FPGA. As another example, a black box in a design file may have a generic name type (e.g., myBlackBox) that provides no information about what type of black box it is.

If a black box in a design file is not recognizable, user intervention is required in order to identify the black box and to assist in the design conversion process. At step 204, warnings are generated and stored in a report file. The warnings stored in the report file include information about any of the black boxes in the HDL design file that could not be recognized and parsed at step 203. User input may be needed to identify any unrecognizable black boxes.

The present invention also converts files that contains timing constraints so that they are compatible with a new (second) FPGA. Each timing constraint is converted so that is compatible with the new FPGA's synthesis tool. For example, each timing constraint typically has a name. The name of each timing constraint in the user constraint files can be changed to new name that the second FPGA's synthesis tool can recognize. Also, the parameters of each timing constraint are changed if they are incompatible with the new FPGA's architecture.

At step 205, each black box instance in the HDL design file is replaced by an equivalent instance that is compatible with the new FPGA using the information gathered at step 203. An equivalent HDL black box instance is created for each black box instance in the design file. Then, the HDL code in the design file is edited to replace the black box instances with their corresponding equivalents.

The present invention uses the information gathered about each black box instance at step 203 to connect the inputs and outputs of the equivalent black box instances together properly. The conversion process works smoothly for black box instances that have the same number and type of ports as their equivalents.

However, some black box instances in a design file may not have exactly the same number or the same type of input and output ports as an equivalent black box. If an equivalent of a black box instance does not have the same number of signals or ports, the present invention can automatically connect the unused ports and dangling signals in the equivalent black box to pre-selected terminals.

For example, a primitive for a new FPGA may have an input port for a reset signal. If a black box instance in a HDL design file does not have an input port for a reset signal, an unused port is created when that black box instance is converted into the primitive for the new FPGA. The information regarding each unused port is saved in a file. The present invention can automatically connect the unused ports to a pre-selected signal. For example, unused reset input ports in each equivalent black box can be automatically coupled to ground during the design conversion process.

As another example, a black box instance in a HDL design file may be coupled to receive a clear signal that resets registers in the black box. If an equivalent black box does not have an input port that can be coupled to the clear signal, the clear signal becomes a dangling signal in the edited design file. The information regarding each dangling signal is saved in a file. The dangling signal can be automatically coupled to a pre-select terminal, such as a power supply terminal, during the design conversion process.

After the conversion process is completed, the user can given an opportunity to alter how the dangling signals and unused ports are connected. For example, the user can be given the opportunity to connect to the these ports and signals to different terminals.

At step 206, each black box declaration in the design file is replaced by an equivalent black box declaration that is compatible with the new FPGA using the information gathered at step 203. An equivalent HDL black box declaration is created for each black box declaration in the design file. Then, the HDL code in the design file is edited to replace the black box declarations with their corresponding equivalents. Some types of HDL design files can be made to be compatible with a new FPGA without changing any other portion of the HDL code, except the black box declarations and instance as describe above.

After a design file has been edited, the end result is a duplicate design file that has been adjusted to contain black boxes targeted for a new FPGA device. The conversion process is automatic and optimized to provide designefficient conversions. A detailed report is also produced indicating where black boxes were found in the HDL code, and what equivalents they were replaced with. The detailed report can also contain the warnings generated at step 204 and additional information messages the user can use to further optimize the design on the new device.

Examples of how a black box conversion process of the present invention can be applied to specific blocks of code are now described for illustrative purposes. These examples are not intended to limit the scope of the present invention.

HDL design files written for FPGAs made by one manufacturer can be converted to HDL design files that are compatible with FPGAs made by another manufacturer. For example, files created for an FPGA made by Xilinx Corporation, Altera Corporation (both of San Jose, Calif.), Lattice Semiconductor, or Actel Corporation can be converted to a file that is compatible with an FPGA made by another one of these manufacturers. The design conversion process uses a design conversion library that contains a list of primitives and their corresponding equivalents. Examples of primitives include RAMs, multipliers, and input/output buffers.

The following block of code is an example of a black box declaration for a RAM block ram400_core written in Xilinx HDL code.

```
component ram400_core
    PORT
    (
    din       :IN STD_LOGIC_VECTOR (39 DOWNTO 0);
    addr      :IN STD_LOGIC_VECTOR (6 DOWNTO 0);
    we        :IN STD_LOGIC :='1';
    clk       :IN STD_LOGIC;
    dout      :OUT STD_LOGIC_VECTOR (39 DOWNTO 0)
    );
end component
```

A design conversion tool of the present invention can automatically edit RAM block ram400_core so that it contain Altera compatible HDL code using mappings for equivalent code stored in the design conversion library. Xilinx and Altera use different conventions to name ports of black boxes. The design conversion tool replaces the names of ports din, addr, we, clk, and dout with the equivalent names data, address, wren, clock, and q. An example of a modified block of code for ram400_core is provided below.

```
component ram400_core
    PORT
    (
    data        :IN STD_LOGIC_VECTOR (39 DOWNTO 0);
    address     :IN STD_LOGIC_VECTOR (6 DOWNTO 0);
    wren        :IN STD_LOGIC :='1';
    clock       :IN STD_LOGIC;
    q           :OUT STD_LOGIC_VECTOR (39 DOWNTO 0)
    );
end component
```

The following block of code is an example of a black box instance for a RAM block inst_RAM400_CORE written in Xilinx HDL code.

```
begin
inst_RAM400_CORE: ram400_core
port map (
        din         =>I,
        addr        =>IA ,
        we          =>WEI ,
        clk         =>CKIA ,
        dout        =>B
);
```

The techniques of the present invention can automatically modify RAM instance inst_RAM400_CORE so that it contain Altera compatible HDL code using mappings for equivalent code stored in the design conversion library. An example of a modified block of code for inst_RAM400_CORE is provided below.

```
begin
inst_RAM400_CORE: ram400_core
PORT MAP (
        data        =>I,        --{Xilinx port din}
        address     =>IA ,      --{Xilinx port addr}
        wren        =>WEI ,     --{Xilinx port we}
        clock       =>CKIA ,    --{Xilinx port clk}
        q           =>B         --{Xilinx port dout}
);
```

A design conversion tool of the present invention can also automatically convert Altera black box instances and declarations to Xilinx equivalent black box instances and declarations using mappings for equivalent code stored in a design conversion library. For example, the names of ports data, address, wren, clock, and q can be replaced with the equivalent names din, addr, we, clk, and dout.

According to one embodiment, a software tool that performs a design conversion process of the present invention can be built in a scripted language that appears to work as an extension of an existing synthesis tool. For example, Altera Corporation's Quartus™ II tool has a built in Tcl interpreter that can execute any generic Tcl code. Tcl stands for tool kit command language. Tcl is an industry standard scripting language used by electronic design automation (EDA) tools.

A design conversion tool of the present invention can be written in generic Tcl code. Rather than being a compiled executable that exists in addition to the Quartus™ II executables, the generic Tcl code becomes a script that is sourced through one of the Quartus™ II executables. When executed, the generic Tcl code brings up a user interface that permits a user to provide input as needed. The advantage of this embodiment is that a user only needs to have Quartus™ II on their system to run an FPGA design conversion tool of the present invention.

According to another embodiment of the present invention, the state of a design conversion can be saved to memory, so that conversions can be stopped and restarted without having to reparse a project from the beginning. This embodiment is advantageous, because HDL design files for complex circuit designs often have thousands of lines of code that may take several hours to convert to a new FPGA compatible format.

The present invention substantially reduces the time required to edit a design file so that it is compatible with a new FPGA. The conversion process is faster, because black boxes in the HDL code are replaced automatically by equivalents, requiring far less input from the user. Thus, the complexity and knowledge required to convert a design file so that is can be implemented in a new FPGA is substantially reduced.

A FPGA design converter of the present invention can provide faster and more advanced VHDL and Verilog parsing using a custom built, regular expression based parsing engines. Two parsing engines create a common set of objects in a database for VHDL and Verilog files. The parsing engines are able to gather more information about black box declarations and black box instances in a circuit design.

The present invention provides field application engineers with a tool that allows them to convert, compare, and win design sockets in a record amount of time. The present invention delivers a push button conversion process that frees applications engineers from the burden of raw conversion and allows them to concentrate on performance optimizations. The simple push button approach is also easy enough for a customer to use, allowing them to convert their designs quickly and easily without having to wait for an engineer to become available.

Referring again to FIG. 1, the converted design file is verified at step 106. The verification step can include any desired error checking procedure to verify the accuracy of the conversion process. At step 107, the circuit design is compiled by compiling the converted design file and the converted constraints file using a synthesis tool compatible with the new programmable IC.

Figure 3:
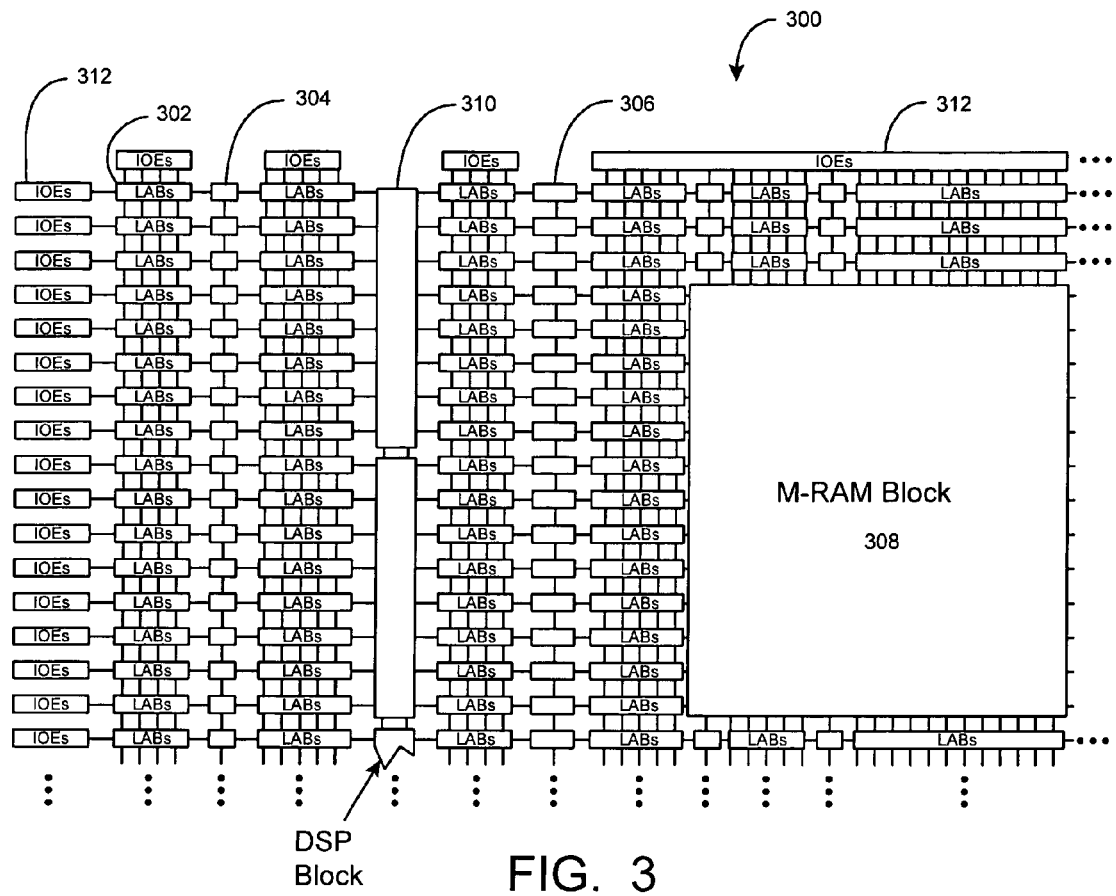
FIG. 3 is a simplified block diagram of a programmable logic device that can be used with the techniques of the present invention.

The techniques of the present invention can used to convert a design file so that it is compatible with a new PLD, FPGA, or any other type of programmable logic IC. FIG. 3 is a simplified partial block diagram of an example of a PLD 300. It should be understood that the present invention can be used to convert designs for numerous types of programmable integrated circuits. PLD 300 is an example of a programmable integrated circuit for which techniques of the present invention can be implemented. PLD 300 includes a two-dimensional array of programmable logic array blocks (or LABs) 302 that are interconnected by a network of column and row interconnects of varying length and speed. LABs 302 include multiple (e.g., 10) logic elements (or LEs).

An LE is a programmable logic block that provides for efficient implementation of user defined logic functions. PLD 300 has numerous logic elements that can be configured to implement various combinatorial and sequential functions. The logic elements have access to a programmable interconnect structure. The programmable interconnect structure can be programmed to interconnect the logic elements in almost any desired configuration.

PLD 300 also includes a distributed memory structure including RAM blocks of varying sizes provided throughout the array. The RAM blocks include, for example, 512 bit blocks 304, 4K blocks 306 and a block 308 that provides 512K bits of RAM. These memory blocks can also include shift registers and FIFO buffers.

PLD 300 further includes digital signal processing (DSP) blocks 310 that can implement, for example, multipliers with add or subtract features. I/O elements (IOEs) 312 located, in this example, around the periphery of the device support numerous single-ended and differential I/O standards. It is to be understood that PLD 300 is described herein for illustrative purposes only and that the present invention can be implemented for many different types of PLDs, FPGAs, and the like.

Figure 4:
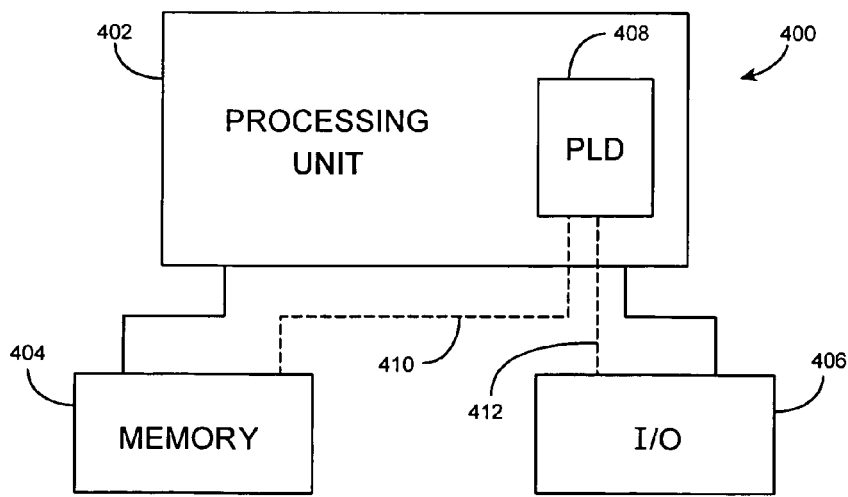
FIG. 4 is a block diagram of an electronic system that can implement embodiments of the present invention.

While PLDs of the type shown in FIG. 3 provide many of the resources required to implement system level solutions, the present invention can also benefit systems wherein a PLD is one of several components. FIG. 4 shows a block diagram of an exemplary digital system 400, for which the present invention can be implemented. System 400 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 400 can be provided on a single board, on multiple boards, or within multiple enclosures.

System 400 includes a processing unit 402, a memory unit 404 and an I/O unit 406 interconnected together by one or more buses. According to this exemplary embodiment, a programmable logic device (PLD) 408 is embedded in processing unit 402. PLD 408 can serve many different purposes within the system in FIG. 4. PLD 408 can, for example, be a logical building block of processing unit 402, supporting its internal and external operations. PLD 408 is programmed to implement the logical functions necessary to carry on its particular role in system operation. PLD 408 can be specially coupled to memory 404 through connection 410 and to I/O unit 406 through connection 412.

Processing unit 402 can direct data to an appropriate system component for processing or storage, execute a program stored in memory 404 or receive and transmit data via I/O unit 406, or other similar function. Processing unit 402 can be a central processing unit (CPU), microprocessor, floating point coprocessor, graphics coprocessor, hardware controller, microcontroller, programmable logic device programmed for use as a controller, network controller, and the like. Furthermore, in many embodiments, there is often no need for a CPU.

For example, instead of a CPU, one or more PLDs 408 can control the logical operations of the system. In an embodiment, PLD 408 acts as a reconfigurable processor, which can be reprogrammed as needed to handle a particular computing task. Alternately, programmable logic device 408 can itself include an embedded microprocessor. Memory unit 404 can be a random access memory (RAM), read only memory (ROM), fixed or flexible disk media, PC Card flash disk memory, tape, or any other storage means, or any combination of these storage means.

While the present invention has been described herein with reference to particular embodiments thereof, a latitude of modification, various changes, and substitutions are intended in the present invention. In some instances, features of the invention can be employed without a corresponding use of other features, without departing from the scope of the invention as set forth. Therefore, many modifications may be made to adapt a particular configuration or method disclosed, without departing from the essential scope and spirit of the present invention. It is intended that the invention not be limited to the particular embodiments disclosed, but that the invention will include all embodiments and equivalents falling within the scope of the claims.

What is claimed is:

1. A computer program product for editing a file describing a circuit design for a first programmable logic integrated circuit so that HDL code in the file is compatible with a new programmable logic integrated circuit (IC) the computer program product comprising:
   code for locating black box declarations and black box instances in the file;
   code for gathering information about the black box declarations and instances, wherein a black box represents a circuit block within a circuit design and the information gathered represents one or more attributes of a circuit block represented by a black box;
   code for editing the black box declarations to create equivalent black box declarations that are compatible with the new programmable logic IC using the information;
   code for editing the black box instances to create equivalent black box instances that are compatible with the new programmable logic IC using the information;
   code for generating a detailed report that indicates where the black box declarations and instances were found in the code and the equivalent declarations and instances that the black boxes were replaced with; and
   a computer readable medium for storing the codes.

2. The computer program product defined in claim 1 further comprising:
   code for generating a warning if an equivalent black box compatible with the new programmable logic IC cannot be located for one of the black box instances or declarations.

3. The computer program product defined in claim 1 further comprising:
   code for automatically connecting any dangling signals or unused ports in the equivalent black box instances to pre-selected terminals.

4. The computer program product defined in claim 1 wherein the code for gathering the information about the black box declarations further comprises code for determining a number of input ports and output ports for each of the black box declarations.

5. The computer program product defined in claim 4 wherein the code for gathering the information about the black box instances further comprises code for identifying input signals coupled to each input port of the black box instances, and code for identifying output signals coupled to each output port of the black box instances.

6. The computer program product defined in claim 1 wherein the code for gathering the information about the black box declarations further comprises code for determining a function performed by each of the black box declarations.

7. The computer program product defined in claim 1 wherein the computer program product comprises Tcl code that is executed as a script sourced through an executable in a synthesis tool.

8. The computer program product defined in claim 1 further comprising:
   code for stopping and restarting the codes that implement a design conversion process for the circuit design without having to reparse the design conversion process from the beginning; and
   code for saving a state of the design conversion process to memory.

9. The computer program product defined in claim 1 further comprising:
   code for converting timing constraints associated with the circuit design to be compatible with the new programmable logic IC.

10. The computer program product defined in claim 1 wherein the code for locating black box declarations and black box instances in the file further comprises code for identifying blocks of code that do not have body definitions as black box declarations.

11. A method for editing an HDL file describing a circuit design of a first programmable logic integrated circuit so that the file is compatible with a new programmable logic integrated circuit (IC), the computer program product comprising:
   identifying black box declarations in the file, wherein the step of identifying black box declarations in the file includes identifying blocks of code that do not have body definitions;
   identifying black box instances in the file;
   collecting information about the black box declarations and instances, wherein a black box represents a circuit block within a circuit design and the information collected represents one or more attributes of a circuit block represented by a black box;
   editing the black box declarations to create equivalent black declarations that are compatible with the new programmable logic IC using the information; and
   editing the black box instances to create equivalent black box instances that are compatible with the new programmable logic IC using the information.

12. The method defined in claim 11 further comprising:
   generating a warning if an equivalent black box compatible with the new programmable logic IC cannot be located for one of the black box instances or declarations.

13. The method defined in claim 11 further comprising:
   automatically connecting any dangling signals or unused ports in the equivalent black box instances to preselected terminals.

14. The method defined in claim 11 wherein collecting the information about the black box declarations further comprises determining a number of input ports and output ports for each of the black box declarations.

15. The method defined in claim 14 wherein collecting the information about the black box instances further comprises identifying input signals coupled to each input port of the black box instances, and identifying output signals coupled to each output port of the black box instances.

16. The method defined in claim 11 wherein collecting the information about the black box declarations further comprises determining a function performed by each of the black box declarations.

17. The method defined in claim 11 further comprising:
   converting timing constraints associated with the circuit design to be compatible with the new programmable logic IC.

18. The method defined in claim 11 further comprising:
   generating a detailed report that indicates where the black box declarations and instances were found and the equivalent declarations and instances that the black boxes were replaced with.

* * * * *

UNITED STATES PATENT AND TRADEMARK OFFICE
CERTIFICATE OF CORRECTION

PATENT NO. : 7,389,489 B1
APPLICATION NO. : 10/840206
DATED : June 17, 2008
INVENTOR(S) : Chesal et al.

Page 1 of 1

It is certified that error appears in the above-identified patent and that said Letters Patent is hereby corrected as shown below:

Column 11, line 22, delete "computer program product", and insert -- method. --

Signed and Sealed this

Second Day of September, 2008

JON W. DUDAS
*Director of the United States Patent and Trademark Office*